United States Patent [19]

Yasunaga

[11] Patent Number: 5,122,389
[45] Date of Patent: Jun. 16, 1992

[54] VACUUM EVAPORATION METHOD AND APPARATUS

[75] Inventor: Tadashi Yasunaga, Kanagawa, Japan

[73] Assignee: Fuji Photo Film Co., Ltd., Kanagawa, Japan

[21] Appl. No.: 662,309

[22] Filed: Feb. 28, 1991

[30] Foreign Application Priority Data

Mar. 2, 1990 [JP] Japan .................. 2-51249
Mar. 5, 1990 [JP] Japan .................. 2-51636
Apr. 6, 1990 [JP] Japan .................. 2-91569
Feb. 20, 1991 [JP] Japan .................. 3-45532

[51] Int. Cl.⁵ .................................. C23C 14/30
[52] U.S. Cl. .................................. 427/42; 427/250; 118/726; 118/727; 219/121.15
[58] Field of Search .................. 118/726, 727; 219/121.15; 392/388, 389; 427/42, 250

[56] References Cited

U.S. PATENT DOCUMENTS 4,516,525 5/1985 Bourgeois .................. 118/727
4,620,081 10/1986 Zeren .................. 219/121.15
4,632,059 12/1986 Flatscher .................. 427/42

Primary Examiner—Richard Bueker
Attorney, Agent, or Firm—Sughrue, Mion, Zinn, Macpeak & Seas

[57] ABSTRACT

Two heat-resistant rollers are located close to each other such that rotation shafts of the two heat-resistant rollers are approximately parallel to each other, and parts of the two heat-resistant rollers are immersed in a deposition material, which has been molten in a crucible. The two heat-resistant rollers are rotated in opposite directions. Parts of the molten deposition material are entrained by the circumferential surfaces of the two heat-resistant rollers, and a concave part of the molten deposition material is formed at a region, at which the entrained parts of the molten deposition material come into contact with each other. An electron beam is irradiated to the concave part of the molten deposition material. The molten deposition material is thereby evaporated from the concave part such that the resulting stream of vapor of the molten deposition material may be directed at an oblique angle or approximately horizontally with respect to the surface of the molten deposition material in the region other than the region in which the two heat-resistant rollers are located. A thin film of the deposition material is thus deposited on the substrate.

37 Claims, 9 Drawing Sheets

F I G. 4
F I G. 5
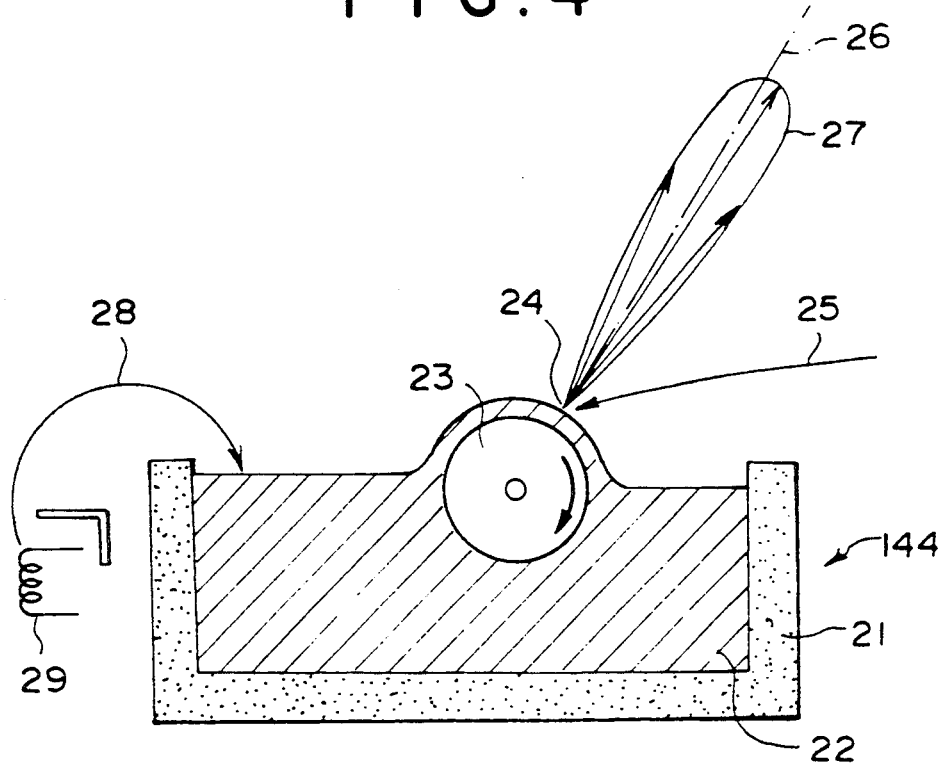
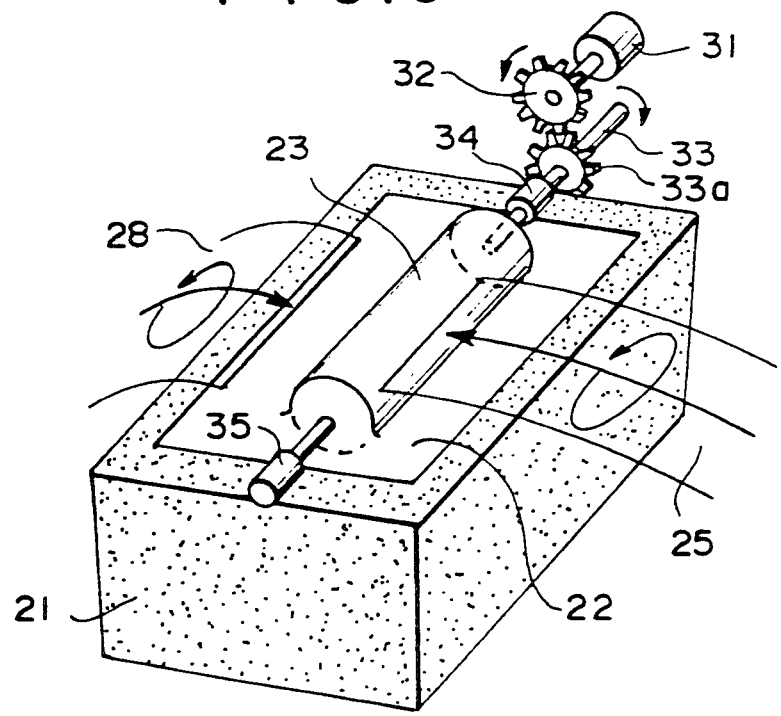

VACUUM EVAPORATION METHOD AND APPARATUS

BACKGROUND OF THE INVENTION

1. Field of the Invention

This invention relates to a method and apparatus for evaporating a deposition material, such as a magnetic material, and depositing a thin film of the deposition material on a substrate of a tape, a disk, or the like, in a vacuum. This invention particularly relates to a vacuum evaporation method and a vacuum evaporation apparatus wherein a deposition material is evaporated with an electron beam.

2. Description of the Prior Art

As media for recording and reproducing magnetic information, coated types of magnetic recording media have heretofore been used widely. The coated type of magnetic recording media comprise a non-magnetic substrate and a magnetic layer overlaid on the non-magnetic substrate. The magnetic layer is formed by applying a magnetic coating composition, which contains magnetic grains and an organic binder, or the like, to the non-magnetic substrate and then drying it.

Nowadays there is a strong demand for magnetic recording media on which magnetic information can be recorded at high densities. This demand cannot be satisfied with the conventional coated types of magnetic recording media. For example, in a Hi-8 system, magnetic information is recorded at a high density with wavelengths shorter than 0.5 μm. For such a system, thin metal film types of magnetic recording media are substantially suitable and have been used in practice. The thin metal film types of magnetic recording media comprise a non-magnetic substrate and a thin ferromagnetic metal film overlaid on the non-magnetic substrate. The thin metal film types of magnetic recording media are advantageous in that they have a high magnetic energy level and the thickness of the magnetic layer can be kept thin.

Thin metal films can be formed with wet processes, such as electrolytic plating and electroless plating processes. Thin metal films can also be formed with dry processes, such as vacuum evaporation, ion plating, sputtering, and chemical vapor deposition (CVD) processes. From the point of view of the rate, with which thin metal films are formed, and the productivity, vacuum evaporation processes are most advantageous among the above-enumerated processes.

As examples of thin metal film types of magnetic recording media, vapor deposition tapes are utilized. Vacuum evaporation processes are also utilized to make vapor deposition tapes. In the vacuum evaporation processes, electron beams are employed widely such that metals, which have high melting points and primarily contain Co, may be evaporated quickly. Particularly, among the vacuum evaporation processes utilizing electron beams, oblique incidence vacuum evaporation processes are employed such that necessary magnetic characteristics, e.g. the coercive force (Hc) and the squareness ratio (SQ), may be obtained. With the oblique incidence vacuum evaporation processes, only part of a stream of vapor is deposited on a substrate.

FIG. 12 is a schematic view showing a conventional vacuum evaporation process. A deposition material 2 is contained in a refractory crucible 1. The deposition material 2 is heated, molten, and evaporated by an electron beam 3. The resulting stream of vapor 4 of the deposition material 4 impinges upon a substrate (not shown), and a thin film of the deposition material 4 is thereby formed on the substrate.

FIG. 13 is a perspective view showing the crucible 1. In general, the crucible 1 has a large width, which width is taken in the width direction of a substrate, and the electron beam 3 scans the deposition material 2 along the width direction of the crucible 1 such that the stream of vapor 4 may continuously impinge upon a wide substrate.

As descried in, for example, "Vacuum Handbook", Nihon Shinku Gijutsu K.K., p. 231, in cases where the source of the stream of vapor 4 is a point source, the stream of vapor 4 has a $\cos^n \alpha$ distribution. Therefore, if such a technique is combined with an oblique incidence vacuum evaporation process, the problems will occur in that the efficiency, with which a thin film of the deposition material is formed, cannot be kept high. Specifically, as shown in FIG. 14, a substrate 10 is fed from a feed shaft 11, conveyed along the circumferential surface of a cooling can 13, and wound around a wind-up shaft 12. Also, a deposition material contained in a crucible 15 is evaporated in a vacuum chamber, and the resulting stream of vapor 16 impinges upon the substrate 10. In this manner, a thin film of the deposition material is formed on the substrate 10. At this time, the angle of incidence of the stream of vapor 16 upon the substrate 10 is limited by a shield plate 14. Specifically, only part 16a of the stream of vapor 16, which part is hatched in FIG. 14, impinges upon the substrate 10, and the other part of the stream of vapor 16 impinges upon inner wall surfaces of the vacuum chamber, or the like. Therefore, with the conventional process, only part of the stream of vapor 16 is utilized to form a thin film of the deposition material, and the efficiency, with which a thin film of the deposition material is formed, cannot be kept high (e.g. the efficiency is at most 10%). Accordingly, the efficiency, with which the deposition material is utilized, is low, and the productivity cannot be kept high.

SUMMARY OF THE INVENTION

The primary object of the present invention is to provide a vacuum evaporation method, wherein a deposition material is utilized efficiently and the productivity is kept high.

Another object of the present invention is to provide a vacuum evaporation method, which enables a plurality of layers to be deposited on a substrate such that the apparatus for carrying the vacuum evaporation method may be kept small in size.

A further object of the present invention is to provide a vacuum evaporation method, with which thin films having good quality are formed on substrates.

A still further object of the present invention is to provide an apparatus for carrying out the vacuum evaporation method.

The present invention provides a first vacuum evaporation method in which a deposition material is introduced into a crucible, heated, and evaporated in a vacuum, the resulting stream of vapor of the deposition material is caused to impinge upon a substrate, and a thin film of the deposition material is thereby deposited on the substrate, wherein the improvement comprises the steps of:

i) locating two heat-resistant rollers close to each other such that rotation shafts of two said heat-resistant rollers are approximately parallel to each other, and parts of two said heat-resistant rollers are immersed in the deposition material, which has been molten in said crucible.

ii) rotating two said heat-resistant rollers in opposite directions, whereby parts of said molten deposition material are entrained by the circumferential surfaces of two said heat-resistant rollers, and a concave part of said molten deposition material is formed at a region, at which said entrained parts of said molten deposition material come into contact with each other, and iii) irradiating an electron beam to said concave part of said molten deposition material, said molten deposition material being thereby evaporated from said concave part such that the resulting stream of vapor of said molten deposition material may be directed at an oblique angle or approximately horizontally with respect to the surface of said molten deposition material in the region other than the region in which two said heat-resistant rollers are located, whereby a thin film of said deposition material is deposited on said substrate.

The present invention also provides a first vacuum evaporation apparatus comprising:

i) a crucible for accommodating a molten deposition material therein, ii) two heat-resistant rollers, which are located close to each other such that rotation shafts of two said heat-resistant rollers are approximately parallel to each other, and parts of two said heat-resistant rollers are immersed in said molten deposition material in said crucible, iii) a roller rotating mechanism for rotating two said heat-resistant rollers in opposite directions, whereby parts of said molten deposition material are entrained by the circumferential surfaces of two said heat-resistant rollers, and a concave part of said molten deposition material is formed at a region, at which said entrained parts of said molten deposition material come into contact with each other, and iv) an electron beam generating means for irradiating an electron beam to said concave part of said molten deposition material, said molten deposition material being thereby evaporated from said concave part such that the resulting stream of vapor of said molten deposition material may be directed at an oblique angle or approximately horizontally with respect to the surface of said molten deposition material in the region other than the region in which two said heat-resistant rollers are located, whereby a thin film of said deposition material is deposited on a substrate.

With the first vacuum evaporation method and the first vacuum evaporation apparatus in accordance with the present invention, two heat-resistant rollers are located close to and facing each other. Parts of the two heat-resistant rollers are immersed in the deposition material, which has been molten in the crucible. The two heat-resistant rollers are rotated in opposite directions. As a result, parts of the molten deposition material are entrained by the circumferential surfaces of the two heat-resistant rollers, and a concave part of the molten deposition material is formed at a region, at which the entrained parts of the molten deposition material come into contact with each other. An electron beam is irradiated to the concave part of the molten deposition material. When the electron beam is thus irradiated to the concave part of the molten deposition material, the molten deposition material is evaporated from the concave part. The stream of vapor of the deposition material thus generated has a high directivity along a line, which is normal to the concave surface formed at the bottom of the concave part of the molten deposition material. Therefore, the efficiency, with which the deposition material is deposited on a substrate, can be kept higher than conventional techniques. Also, the efficiency, with which the deposition material is utilized, and the productivity can be kept high.

The present invention further provides a second vacuum evaporation method in which a deposition material is introduced into a crucible, heated, and evaporated in a vacuum, the resulting stream of vapor of the deposition material is caused to impinge at an oblique angle of incidence upon a substrate, and a thin film of the deposition material is thereby deposited on the substrate, said substrate being positioned along a circumferential surface of a rotatable drum, wherein the improvement comprises the steps of:

i) locating a heat-resistant roller such that part of said heat-resistant roller is immersed in the deposition material, which has been molten in said crucible, ii) rotating said heat-resistant roller, whereby part of said molten deposition material is entrained by the circumferential surface of said heat-resistant roller, and iii) irradiating an electron beam to said entrained part of said molten deposition material at a position on the circumferential surface of said heat-resistant roller, which position is spaced away from the top of said heat-resistant roller, said molten deposition material being thereby evaporated from said position such that the resulting stream of vapor of said molten deposition material may be directed at an oblique angle or approximately horizontally with respect to the surface of said molten deposition material in the region other than the region in which said heat-resistant roller is located, whereby a thin film of said deposition material is deposited on said substrate.

The present invention still further provides a second vacuum evaporation apparatus comprising:

i) a crucible for accommodating a molten deposition material therein, ii) a heat-resistant roller, which is located such that part of said heat-resistant roller is immersed in the deposition material, which has been molten in said crucible, iii) a roller rotating mechanism for rotating said heat-resistant roller, whereby part of said molten deposition material is entrained by the circumferential surface of said heat-resistant roller, and iv) an electron beam generating means for irradiating an electron beam to said entrained part of said molten deposition material at a position on the circumferential surface of said heat-resistant roller, which position is spaced away from the top of said heat-resistant roller, said molten deposition material being thereby evaporated from said position such that the resulting stream of vapor of said molten deposition material may be directed at an oblique angle or approximately horizontally with respect to the surface of said molten deposition material in the region other than the region in which said heat-resistant roller is located, wherein said crucible is located such that said stream of vapor of said molten deposition material may impinge at an oblique angle of incidence upon a substrate, and a thin film of said deposition material may be thereby deposited on the substrate, said substrate being positioned along a circumferential surface of a rotatable drum.

With the second vacuum evaporation method and the second vacuum evaporation apparatus in accordance with the present invention, the heat-resistant roller is located such that part of the heat-resistant roller is immersed in the deposition material, which has been molten in the crucible. The heat-resistant roller is then rotated. As a result, part of the molten deposition material is entrained by the circumferential surface of the heat-resistant roller. An electron beam is irradiated to the entrained part of the molten deposition material at a position on the circumferential surface of the heat-resistant roller, which position is spaced away from the top of the heat-resistant roller. In this manner, the molten deposition material is evaporated from said position. A line, which is normal to the circumferential surface of the heat-resistant roller at the position that is exposed to the electron beam, is inclined with respect to the surface of the part of molten deposition material contained in the crucible, which part is other than the part entrained by the heat-resistant roller. Therefore, the stream of vapor of the molten deposition material, which is generated during the irradiation of the electron beam, has a $\cos^n \alpha$ distribution around the line, which is normal to the circumferential surface of the heat-resistant roller. In cases where the distribution of the stream of vapor of the deposition material is thus inclined, the stream of vapor of the deposition material around the line, which is normal to the circumferential surface of the heat-resistant roller at the position that is exposed to the electron beam, can be utilized efficiently in order to form a thin film of the deposition material on the substrate. Therefore, the efficiency, with which the deposition material is deposited on a substrate, can be kept higher than conventional techniques.

The present invention also provides a third vacuum evaporation method comprising the steps of:

i) continuously causing a deposition material, which has been molten, to flow downwardly.

ii) irradiating an electron beam to the stream of said molten deposition material at a predetermined position on the stream of said molten deposition material, said molten deposition material being thereby evaporated from said predetermined position such that the resulting stream of vapor of said molten deposition material may be directed along a line, which is normal to the surface of the stream of said molten deposition material, and iii) causing the stream of vapor of said molten deposition material to impinge upon a long strip-shaped flexible substrate, which is being moved continuously, whereby a thin film of said deposition material is deposited on said long strip-shaped flexible substrate.

The present invention further provides a third vacuum evaporation apparatus, which is provided with a hearth comprising:

i) a first crucible, which is provided with a heating means for melting a deposition material and from which the molten deposition material flows continuously downwardly, ii) a guide member for guiding said molten deposition material, which has flowed from said first crucible, along a predetermined direction and at a predetermined angle of inclination, such that the stream of said molten deposition material, which is being guided by said guide member, may face a cooling can, iii) a second crucible for receiving said molten deposition material, which has flowed along said guide member, and iv) an electron beam generating means for generating an electron beam, wherein said electron beam is irradiated to the stream of said molten deposition material, which is being guided by said guide member, at a predetermined position on the stream of said molten deposition material, said molten deposition material being thereby evaporated from said predetermined position such that the resulting stream of vapor of said molten deposition material may be directed along a line, which is normal to the surface of the stream of said molten deposition material, and the stream of vapor of said molten deposition material is caused to impinge upon a long strip-shaped flexible substrate, which is being moved continuously along the circumferential surface of said cooling can, whereby a thin film of said deposition material is deposited on said long strip-shaped flexible substrate.

With the third vacuum evaporation method and the third vacuum evaporation apparatus in accordance with the present invention, a deposition material, which has been molten, continuously flows downwardly. An electron beam is irradiated to the stream of the molten deposition material at a predetermined position on the stream of the molten deposition material. The molten deposition material is thereby evaporated from the predetermined position, and the resulting stream of vapor of the molten deposition material is directed along a line, which is normal to the surface of the stream of the molten deposition material. The stream of vapor of the molten deposition material impinges upon a long strip-shaped flexible substrate, which is being moved continuously. In this manner, a thin film of the deposition material is deposited on the substrate.

By appropriately inclining the direction, along which the molten deposition material flows, the center axis of the directivity of the stream of vapor of the molten deposition material, which stream of vapor is directed along the line which is normal to the surface of the stream of the molten deposition material, can be directed so as to impinge at a predetermined angle of incidence upon the long strip-shaped flexible substrate. Therefore, a large part of the stream of vapor of the molten deposition material can impinge at a predetermined angle of incidence upon the long strip-shaped flexible substrate and thus can participate in the formation of a thin film of the deposition material. Accordingly, with the third vacuum evaporation method and the third vacuum evaporation apparatus in accordance with the present invention, the efficiency, with which the deposition material is deposited on the long strip-shaped flexible substrate, can be kept high. Also, the center axis of the directivity of the stream of vapor of the molten deposition material can be inclined to an arbitrary direction. Therefore, for example, in cases where a thin ferromagnetic metal film is to be deposited as a magnetic layer on the long strip-shaped flexible substrate, the angle of incidence of the stream of vapor of the deposition material upon the long strip-shaped flexible substrate can be set to an appropriate value such that the deposited magnetic layer may have good magnetic characteristics. In this manner, a magnetic recording medium having good magnetic characteristics can be made.

As described above, with the third vacuum evaporation method and the third vacuum evaporation apparatus in accordance with the present invention, the efficiency, with which the deposition material is deposited on the long strip-shaped flexible substrate, can be kept high. Therefore, the efficiency, with which the deposition material is utilized, can be kept high. Also, the long strip-shaped flexible substrate can be moved quickly during the vacuum evaporation process. Accordingly, the productivity can be kept high. Additionally, with the third vacuum evaporation method and the third vacuum evaporation apparatus in accordance with the present invention, a thin film having good quality can be deposited on the long strip-shaped flexible substrate.

The present invention still further provides a fourth vacuum evaporation method comprising the steps of:

i) producing a first stream of vapor of a deposition material by:

a) continuously causing the deposition material, which has been molten, to flow obliquely downwardly, b) irradiating an electron beam to the stream of said molten deposition material, said molten deposition material being thereby evaporated such that the resulting first stream of vapor of said molten deposition material may be directed along a line, which is normal to the surface of the stream of said molten deposition material, ii) producing a second stream of vapor of a deposition material by irradiating an electron beam to the horizontal surface of the deposition material, which has been molten, said molten deposition material being thereby evaporated such that the resulting second stream of vapor of said molten deposition material may be directed along an approximately vertical direction, and iii) simultaneously irradiating said first stream of vapor and said second stream of vapor to different parts of a long strip-shaped flexible substrate, which is being moved continuously, whereby a plurality of deposited layers are formed on said long strip-shaped flexible substrate with a single, simultaneous operation.

The present invention also provides a fourth vacuum evaporation apparatus comprising:

i) a first crucible, which is provided with a heating means for melting a deposition material and from which the molten deposition material flows continuously downwardly, ii) a guide member for guiding said molten deposition material, which has flowed from said first crucible, at a predetermined angle of inclination, such that the stream of said molten deposition material, which is being guided by said guide member, may face a long strip-shaped flexible substrate, which is being moved continuously along the circumferential surface of a cooling can, iii) another crucible in which a molten deposition material is accommodated such that it may have a horizontal surface facing said long strip-shaped flexible substrate, and iv) a plurality of electron beam generating means for generating electron beams, wherein a first stream of vapor is produced from the surface of the stream of said molten deposition material, which is being guided by said guide member at a predetermined angle of inclination, by irradiating an electron beam to said stream of said molten deposition material and evaporating said molten deposition material, a second stream of vapor is produced from the surface of said molten deposition material, which is accommodated in said another crucible, by irradiating an electron beam thereto, and said first stream of vapor and said second stream of vapor are simultaneously irradiated to different parts of said long strip-shaped flexible substrate, whereby a plurality of deposited layers are formed on said long strip-shaped flexible substrate with a single, simultaneous operation.

In the fourth vacuum evaporation apparatus in accordance with the present invention, said another crucible may serve as a second crucible, which receives the molten deposition material, which has flowed from the first crucible and has been guided along said guide member.

With the fourth vacuum evaporation method and the fourth vacuum evaporation apparatus in accordance with the present invention, the same effects as those of the third vacuum evaporation method and the third vacuum evaporation apparatus in accordance with the present invention can be obtained. Also, with the fourth vacuum evaporation method and the fourth vacuum evaporation apparatus in accordance with the present invention, the streams of vapor can be produced along desired appropriate directions. Therefore, a plurality of streams of vapor can be simultaneously irradiated to different parts of the long strip-shaped flexible substrate, which is being moved continuously along the circumferential surface of a single cooling can, and a plurality of deposited layers can be formed on the long strip-shaped flexible substrate with a single, simultaneous operation. With a conventional technique, in cases where a plurality of crucibles are to be located such that a plurality of streams of vapor produced therefrom may impinge at efficient angles of incidence upon a long strip-shaped flexible substrate, locations of the crucibles that can satisfy the conditions, under which the deposited layers can be formed efficiently, overlap one upon another, and little degree of freedom can be obtained in locating the crucibles. However, with the fourth vacuum evaporation method and the fourth vacuum evaporation apparatus in accordance with the present invention, a markedly high degree of freedom can be obtained in setting the angles at which a plurality of streams of vapor are irradiated, and a plurality of deposited layers can be formed appropriately and efficiently by utilizing a plurality of crucibles for a single cooling can. Also, with the fourth vacuum evaporation method and the fourth vacuum evaporation apparatus in accordance with the present invention, deposition of a plurality of layers can be carried out only with a single cooling can such that the efficiency, with which the deposition materials are deposited, may be kept high and the vacuum evaporation apparatus may be kept small in size.

BRIEF DESCRIPTION OF THE DRAWINGS

FIG. 4 is a schematic sectional view showing part of an embodiment of the second vacuum evaporation apparatus in accordance with the present invention, FIG. 5 is a perspective view showing part of the configuration shown in FIG. 4.

DESCRIPTION OF THE PREFERRED EMBODIMENTS

The present invention will hereinbelow be described in further detail with reference to the accompanying drawings.

Figure 1:
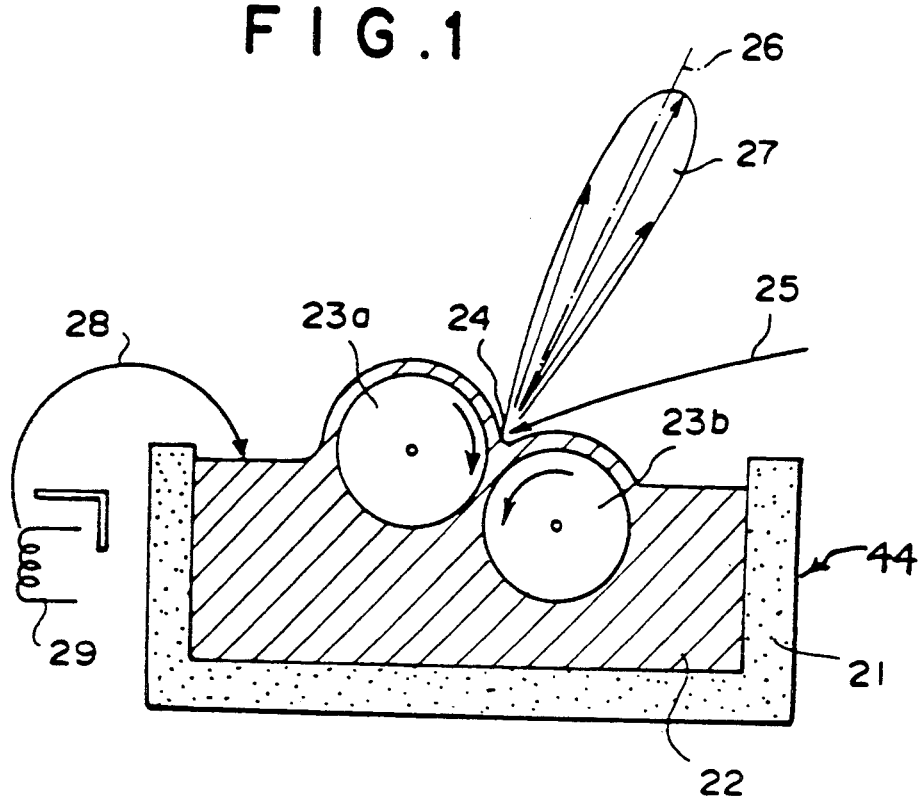
FIG. 1 is a schematic sectional view showing part of an embodiment of the first vacuum evaporation apparatus in accordance with the present invention.

FIG. 1 is a schematic sectional view showing part of an embodiment of the first vacuum evaporation apparatus in accordance with the present invention.

With reference to FIG. 1, at a hearth 44, a deposition material 22 is introduced into a crucible 21 and is molten therein. Thereafter, two heat-resistant rollers 23a and 23b are located close to and facing each other in the crucible 21. The heat-resistant rollers 23a and 23b are rotated in opposite directions by a roller rotating mechanism (not shown). The heat-resistant roller 23a is higher than the heat-resistant roller 23b. When the heat-resistant rollers 23a and 23b are rotated in opposite directions, parts of the molten deposition material are entrained by the circumferential surfaces of the heat-resistant rollers 23a and 23b. A concave part 24 of the molten deposition material is formed at a region, at which the entrained parts of the molten deposition material come into contact with each other. The bottom of the concave part 24 has a concave surface. An electron beam 25 is produced by an electron beam generating means (not shown) and is irradiated to a predetermined region including the concave part 24 of the molten deposition material. When the electron beam 25 is thus irradiated to the concave part 24 of the molten deposition material, the molten deposition material is evaporated and a stream of vapor 27 of the deposition material is generated from the concave part 24.

As described above, the heat-resistant rollers 23a and 23b are located at different heights. Therefore, the concave surface at the bottom of the concave part 24 is formed such that a line 26, which is normal to the concave surface, inclines at an oblique angle with respect to the surface of the molten deposition material in the region other than the region in which the heat-resistant rollers 23a and 23b are located. The stream of vapor 27 of the deposition material thus generated has a high directivity along the line 26, which is normal to the concave surface formed at the bottom of the concave part 24 of the molten deposition material. Also, the directivity of the stream of vapor 27 of the deposition material, which stream of vapor 27 is thus generated from the concave surface formed at the bottom of the concave part 24 of the molten deposition material, along the line 26 which is normal to the concave surface is higher than the directivity of a stream of vapor, which is generated from a flat surface of a molten deposition material, along a line which is normal to the flat surface.

Figure 2:
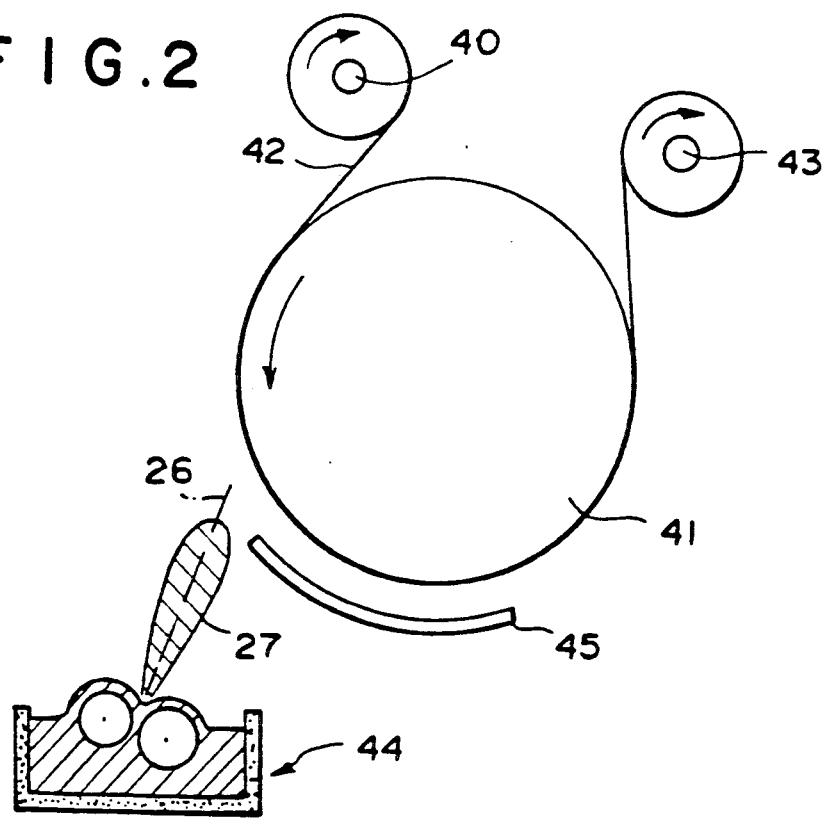
FIG. 2 is a schematic view showing how an oblique incidence vacuum evaporation process is carried out on a substrate with the embodiment, part of which is shown in FIG. 1.
Figure 14:
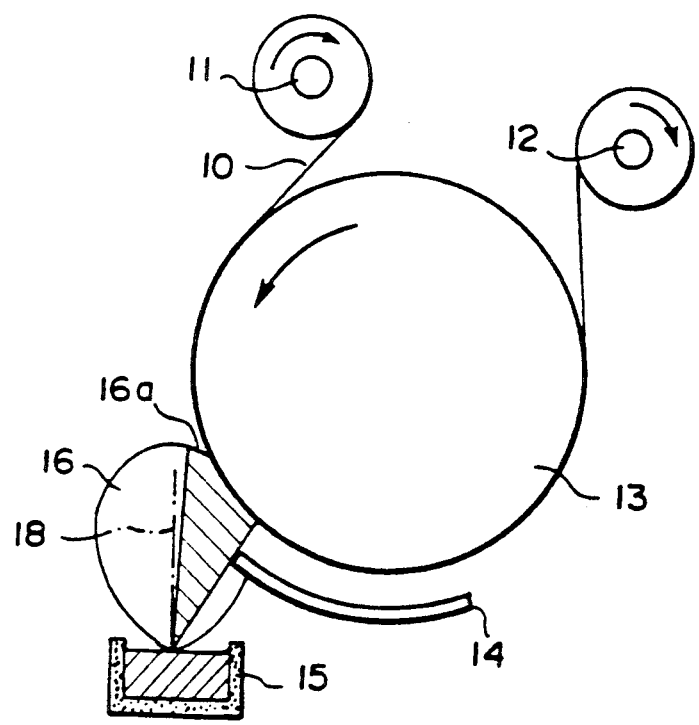

Therefore, as shown in FIG. 2, in cases where this embodiment is applied when an oblique incidence vacuum evaporation process is carried out wherein a deposition material cannot ordinarily be deposited efficiently, the efficiency, with which the deposition material is deposited on a substrate, can be kept high. With reference to FIG. 2, a magnetic tape substrate 42 is fed from a feed roller 40 and moved along the circumferential surface of a cooling can 41. A thin film forming process is carried out on the substrate 42. Thereafter, the substrate 42, on which a thin film has been overlaid, is wound up around a wind-up roller 43. In this embodiment, a stream of vapor 27 of a deposition material is generated by the hearth 44 shown in FIG. 1. The stream of vapor 27 of the deposition material impinges at an oblique angle of incidence upon the surface of the substrate 42, and a thin magnetic film is thereby deposited on the surface. When the shape of the stream of vapor 27 shown in FIG. 1 and the shape of the stream of vapor 16 shown in FIG. 14 are compared with each other, it will be clear that, with this embodiment, a thin film can be formed with the stream of vapor 27 having a higher directivity than the stream of vapor 16. Therefore, with this embodiment, the efficiency, with which the deposition material is utilized, and the productivity can be kept high.

As shown in FIG. 1, this embodiment is provided with an electron beam generating filament 29, which generates a preliminary heating electron beam 28. The preliminary heating electron beam 28 heats the deposition material accommodated in the crucible 21 and keeps it in the molten state. The thin film forming process described above is carried out in a vacuum.

The crucible 21 should preferably be constituted of a refractory material containing, for example, MgO, Al$_2$O$_3$, CaO, or ZrO, as a main constituent. Particularly, a refractory crucible constituted of a material containing MgO as a main constituent is suitable for the vacuum evaporation of metals, which have high melting points and are used in making magnetic recording media. From the point of view of heat resistance and machinability, the heat-resistant rollers 23a and 23b should preferably be constituted of a machinable ceramic material. The machinable ceramic material contains, as a main constituent, MgO, Al$_2$O$_3$, BeO, AlN, BN, a machinable crystallized glass, or the like.

In this embodiment, as a preliminary heating means for heating and melting the deposition material, the means for heating with the electron beam 28 is utilized. Alternatively, any of other preliminary heating means, such as a resistance heating means and an induction heating means, may be employed in accordance with the kind of the deposition material, or the like. An electron beam heating means is suitable for the vacuum evaporation of metals having high melting points.

Figure 3:
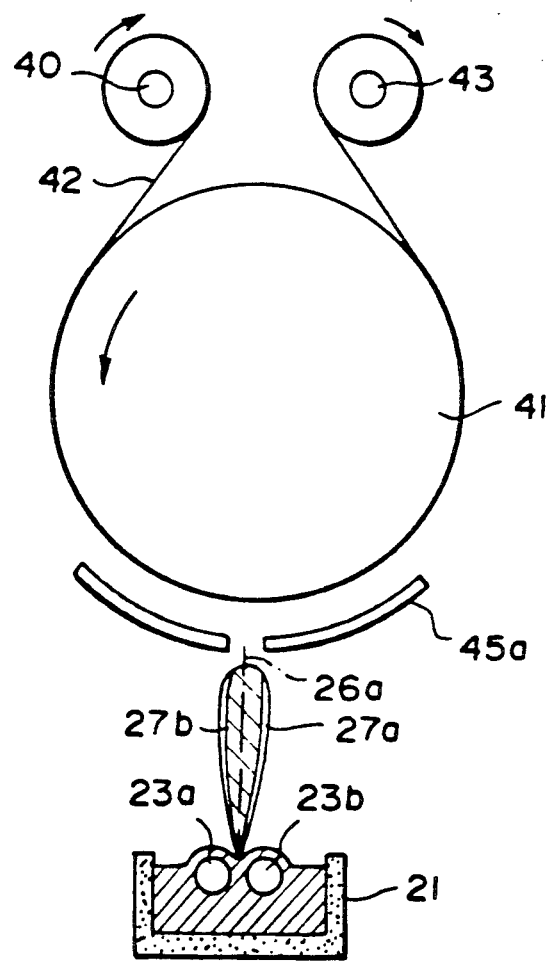
FIG. 3 is a schematic view showing an example of a vacuum evaporation apparatus, which is modified to carry out a vertical incidence vacuum evaporation process.

The first vacuum evaporation apparatus in accordance with the present invention may be modified as shown in FIG. 3. The vacuum evaporation apparatus shown in FIG. 3 differs from the embodiment shown in FIG. 1 in that, instead of being applied to the oblique incidence vacuum evaporation process as sown in FIG. 2, this vacuum evaporation apparatus is applied to a vertical incidence vacuum evaporation process. In FIG. 3, similar elements are numbered with the same reference numerals with respect to FIG. 2.

The vacuum evaporation apparatus shown in FIG. 3 is constituted approximately in the same manner as that in the embodiment of FIG. 1, except that the heat-resistant rollers 23a and 23b are located at approximately equal heights. The heat-resistant rollers 23a and 23b are rotated in opposite directions, and parts of the molten deposition material are entrained by the circumferential surfaces of the heat-resistant rollers 23a and 23b. A concave part of the molten deposition material is formed at a region, at which the entrained parts of the molten deposition material come into contact with each other. At the bottom of the concave part, a concave surface is formed such that a line 26a, which is normal to the concave surface, is approximately perpendicular with respect to the surface of the molten deposition material in the region other than the region in which the heat-resistant rollers 23a and 23b are located.

With the vacuum evaporation apparatus shown in FIG. 3, in the course of carrying out the vertical incidence vacuum evaporation process, the stream of vapor 27a of the deposition material has a high directivity along the line 26a, which is normal to the concave surface formed at the bottom of the concave part of the molten deposition material. As a result, the proportion of a part 27b, which is hatched in FIG. 3 and is not blocked by shield plates 45a, 45a, to the whole stream of vapor 27a can be kept large. Therefore, the efficiency, with which the deposition material is deposited on a substrate, can be kept high. Also, in cases where this vacuum evaporation apparatus is applied when vertical magnetization types of magnetic recording media are made, magnetic recording layers can be formed with a stream of vapor of the deposition material, which contains many vertical vapor components, and therefore the magnetic characteristics of the magnetic recording layers can be kept good.

Embodiments of the second vacuum evaporation apparatus in accordance with the present invention will be described hereinbelow.

FIG. 4 is a schematic sectional view showing part of an embodiment of the second vacuum evaporation apparatus in accordance with the present invention.

With reference to FIG. 4, at a hearth 144, a deposition material 22 is introduced into a crucible 21 and is molten therein. Thereafter, a single heat-resistant roller 23 is located in the crucible 21 such that part of the heat-resistant roller 23 is immersed in the molten deposition material. The heat-resistant roller 23 is rotated by a roller rotating mechanism (not shown). When the heat-resistant roller 23 is rotated, part of the molten deposition material is entrained by the circumferential surface of the heat-resistant roller 23. In this state, an electron beam 25 is produced by an electron beam generating means (not shown). The electron beam 25 is irradiated to the entrained part of the molten deposition material at a position on the circumferential surface of the heat-resistant roller 23, which position is spaced away from the top of the heat-resistant roller 23. When the electron beam 25 is thus irradiated to said position on the entrained part of the molten deposition material, the molten deposition material is evaporated and a stream of vapor 27 of the deposition material is generated from said position.

As shown in FIG. 4, the line 26, which is normal to the circumferential surface of the heat-resistant roller 23 at the position that is exposed to the electron beam 25, inclines at an oblique angle with respect to the surface of the molten deposition material in the region other than the region in which the heat-resistant roller 23 is located. The stream of vapor 27 of the deposition material thus generated has a $\cos^n \alpha$ distribution around the line 26, which is normal to the circumferential surface of the heat-resistant roller 23 at the position that is exposed to the electron beam 25 As shown in FIG. 4, this embodiment is provided with an electron beam generating filament 29, which generates a preliminary heating electron beam 28. The preliminary heating electron beam 28 heats the deposition material accommodated in the crucible 21 and keeps it in the molten state.

The roller rotating mechanism is constituted in the manner shown in FIG. 5. Specifically, a gear 32 is secured to a rotation shaft of a drive motor 31. Also, a gear 33a is secured to a rotation shaft 33 of the heat-resistant roller 23. The gears 32 and 33a are engaged with each other. When the drive motor 31 is operated, the heat-resistant roller 23 rotates. The rotation shaft 33 of the heat-resistant roller 23 is supported by bearing mechanisms 34 and 35 on the top surfaces of the side walls of the crucible 21.

Figure 6:
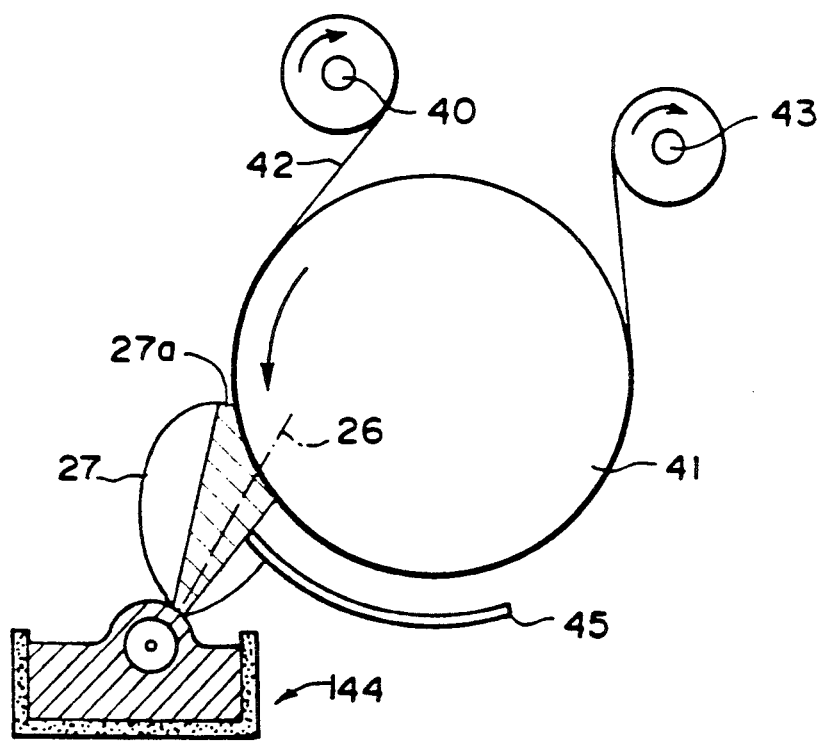
FIG. 6 is a schematic view showing the whole of the embodiment, part of which is shown in FIG. 4.

FIG. 6 is a schematic view showing the whole of the embodiment, part of which is shown in FIG. 4. With reference to FIG. 6, a magnetic tape substrate 42 is fed from a feed roller 40 and moved along the circumferential surface of a cooling can 41. A thin film forming process is carried out on the substrate 42. Thereafter, the substrate 42, on which a thin film has been overlaid, is wound up around a wind-up roller 43. The hearth 144 is located below the cooling can 41 such that the stream of vapor 27 of the deposition material, which is generated by the hearth 144, impinges at an oblique angle of incidence upon the surface of the substrate 42, and a thin magnetic film is thereby deposited on the surface. A shield plate 45 is located below the cooling can 41 such that it limits the angle of incidence of the stream of vapor 27 upon the substrate 42. The thin film forming process described above is carried out in a vacuum.

The crucible 21 shown in FIG. 4 should preferably be constituted of the same refractory materials as those described above for the crucible 21 in the embodiment, part of which is shown in FIG. 1. Also, the heat-resistant roller 23 may be constituted of the same material as that of the heat-resistant rollers 23a and 23b in the embodiment, part of which is shown in FIG. 1.

In this embodiment, as a preliminary heating means for heating and melting the deposition material, the means for heating with the electron beam 28 is utilized. Alternatively, any of other preliminary heating means, such as a resistance heating means and an induction heating means, may be employed in accordance with the kind of the deposition material, or the like. An electron beam heating means is suitable for the vacuum evaporation of metals having high melting points.

Also, the electron beam 25 scans along the width direction of the crucible 21, which width is taken in the width direction of the substrate 42, such that the vacuum evaporation is carried out uniformly in the width direction of the substrate 42. The acceleration voltage for the electron beam 25 should preferably be at least 10 kV.

As described above, in this embodiment, the deposition of a thin film on the substrate 42 is effected with the stream of vapor 27 distributed around the direction, which inclines at an oblique angle with respect to the surface of the molten deposition material in the region other than the region in which the heat-resistant roller 23 is located. Therefore, the efficiency, with which the deposition material is deposited on a substrate, can be kept high. How this effect is obtained will be described hereinbelow by comparing FIGS. 6 and 14 with each other. Specifically, in FIG. 6, only part of the stream of vapor 27, which part impinges upon the substrate 42 at an angle of incidence $\theta$ falling within a predetermined range (hatched in FIG. 6), constitutes an effective stream of vapor 27a, which is capable of contributing to the deposition of a thin film. Also, in FIG. 14, only part of the stream of vapor 16, which part impinges upon the substrate 10 at an angle of incidence $\theta$ falling within a predetermined range (hatched in FIG. 14), constitutes an effective stream of vapor 16a, which is capable of contributing to the deposition of a thin film. In cases where the maximum angle of incidence $\theta$max ($=90°$), the minimum angle of incidence $\theta$min, and the distance between the point, from which the stream of vapor is generated, and the point, at which the stream of vapor impinges upon the substrate, are the same in FIGS. 6 and 14, the effective stream of vapor 27a obtained in the embodiment of the second vacuum evaporation apparatus in accordance with the present invention can be distributed more appropriately around the line 26, which is normal to the circumferential surface of the heat-resistant roller 23 at the position that is exposed to the electron beam 25. On the other hand, the effective stream of vapor 16a obtained with the conventional technique cannot be distributed appropriately around a line 18, which is normal to the surface of the molten deposition material at the position that is exposed to an electron beam. The stream of vapor 27 has a $\cos^n \alpha$ distribution (where $\alpha$ represents the angle of exit with respect to the surface from which the stream of vapor is generated) around the line 26, which is normal to the circumferential surface of the heat-resistant roller 23 at the position that is exposed to the electron beam 25. Therefore, the part of the stream of vapor 27, which part is in the vicinity of the line 26, has a higher density than the other part. Also, the stream of vapor 16 has a $\cos^n \alpha$ distribution around the line 18, which is normal to the surface of the molten deposition material at the position that is exposed to an electron beam. Therefore, the part of the stream of vapor 16, which part is in the vicinity of the line 18, has a higher density than the other part. Accordingly, with this embodiment, the efficiency, with which the deposition material is deposited on a substrate, can be kept higher than the conventional technique.

The second vacuum evaporation method and the second vacuum evaporation apparatus in accordance with the present invention are not limited to the embodiment described above, but may be embodied in various other ways. For example, the position of the hearth 144 with respect to the position of the cooling can 41 may be determined in accordance with, for example, the characteristics which the deposited thin film is required to have.

Embodiments of the third vacuum evaporation apparatus in accordance with the present invention will be described hereinbelow.

Figure 7:
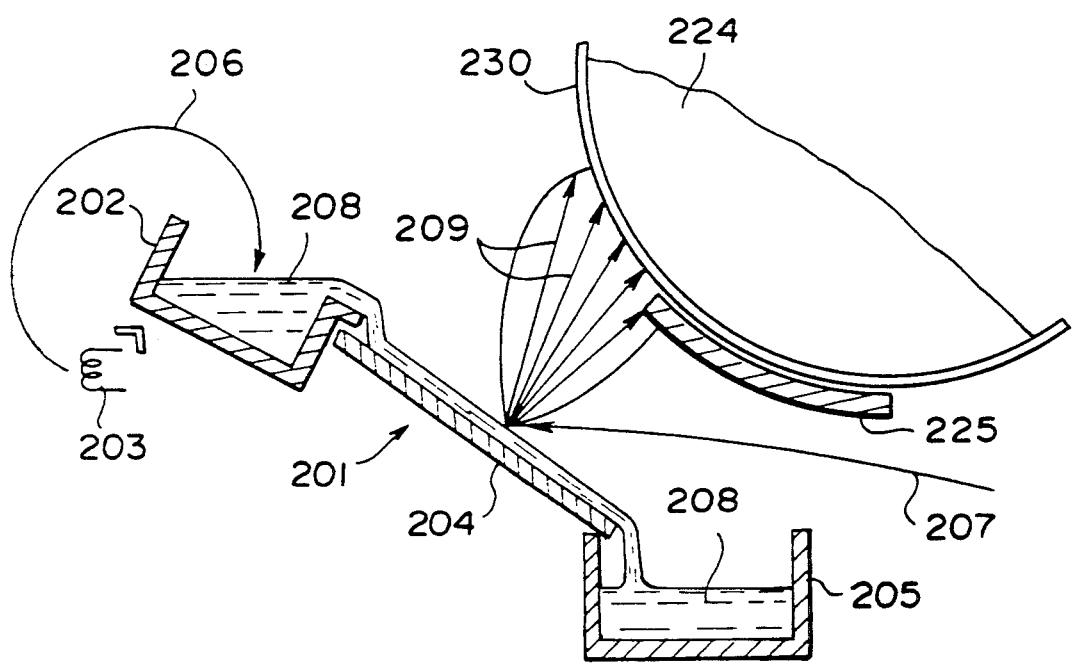
FIG. 7 is a sectional view showing the major part of an embodiment of the third vacuum evaporation apparatus in accordance with the present invention.

FIG. 7 is a sectional view showing the major part of an embodiment of the third vacuum evaporation apparatus in accordance with the present invention.

With reference to FIG. 7, a long strip-shaped flexible substrate (web) 230 is moved continuously along the circumferential surface of a cylindrical cooling can 224 in a vacuum vessel. A hearth 201 is located below the cooling can 224.

The hearth 201 comprises a first crucible 202, which is provided with a preliminary heating means for melting a deposition material, for example, a ferromagnetic metal, such as Fe, Co, or Ni, and from which the molten deposition material flows continuously downwardly. The hearth 201 also comprises a guide member 204 for guiding the molten deposition material 208, which has flowed from the first crucible 202, along a predetermined direction and at a predetermined angle of inclination. The hearth 201 further comprises a second crucible 205 for receiving the molten deposition material 208, which has flowed along the guide member 204, and an electron beam generating means (not shown) for generating an electron beam 207.

The first crucible 202 is constituted of a heat-resistant vessel and can swing around a rotation axis extending in the width direction of the first crucible 202, which direction is normal to the plane of the sheet of FIG. 7. A cutaway part is formed at the upper edge of the side wall of the first crucible 202, which side wall faces the guide member 204. The cutaway part extends along the width direction of the first crucible 202. The deposition material accommodated in the first crucible 202 is heated and molten by an electron beam 206 produced by an electron beam generating filament 203, which is located in the vicinity of the first crucible 202. Thereafter, the first crucible 202 is swung by an appropriate angle such that the cutaway part moves downwardly, and the molten deposition material 208 is allowed to flow from the cutaway part continuously and uniformly over approximately the whole width of the first crucible 202. The electron beam 206 merely heats and melts the deposition material, but does not evaporate it.

The guide member 204 is provided with a wide groove having a slant bottom surface, which faces the circumferential surface of the cooling can 224 and is located such that at least a line, which is normal to the slant bottom surface, intersects perpendicularly to the width direction of the web 230. The guide member 204 guides the molten deposition material 208, which has flowed from the first crucible 202, at a predetermined angle of inclination. The angle of inclination of the guide member 204 can be changed arbitrarily.

The second crucible 205 is constituted of a heat-resistant vessel and receives the molten deposition material 208, which flows continuously from the lower edge of the guide member 204. The width of the second crucible 205 is sufficiently large with respect to the width of the stream of the molten deposition material 208 guided by the guide member 204.

The first crucible 202, the guide member 204, and the second crucible 205 are constituted of a refractory material containing MgO, Al$_2$O$_3$, CaO, ZrO, or the like.

When the hearth 201 is used during the deposition of a thin metal film on the web 230, the electron beam 207 is irradiated to a predetermined position on the stream of the molten deposition material 208, which is continuously flowing in the wide groove of the guide member 204. The electron beam 207 scan along the width direction of the wide groove. The acceleration voltage for the electron beam 207 should preferably be at least 10 kV. As a result, a stream of vapor 209 is generated from the surface of the stream of the molten deposition material 208, which was exposed to the electron beam 207. The stream of vapor 209 of the molten deposition material 208 impinges upon the web 230, which is being moved continuously at the position facing the guide member 204. In this manner, a thin film of the deposition material is deposited on the web 230.

The stream of vapor 209 has a density distribution such that the density of vapor is highest along the line, which is normal to the surface of the stream of the molten deposition material 208. which is being guided by the guide member 204. Therefore, the center axis of the directivity of the stream of vapor 209, which is generated from the surface of the stream of the molten deposition material 208 flowing at the predetermined angle of inclination, inclines from the vertical direction by an angle equal to the angle of inclination of the guide member 204. Specifically, by appropriately changing the angle of inclination of the guide member 204, the center axis of the directivity of the stream of vapor 209 can be inclined by an arbitrary angle from the vertical direction.

As described above, the center axis of the directivity of the stream of vapor 209 can be directed so as to impinge at a desired angle of incidence upon the web 230. Therefore, a large part of the stream of vapor 209 can impinge at a predetermined angle of incidence upon the web 230 and thus can participate in the formation of a thin film of the deposition material. Accordingly, the efficiency, with which the deposition material is deposited on the web 230, can be kept high. Also, the center axis of the directivity of the stream of vapor 209 can be inclined to an arbitrary direction. Therefore, for example, in cases where thin ferromagnetic metal film types of magnetic recording media are to be made, the angle of incidence of the stream of vapor 209 upon the web 230 can be set to an appropriate value such that the deposited magnetic layer may have good magnetic characteristics, such as the coercive force Hc and the squareness ratio SQ. In this manner, magnetic recording media having good magnetic characteristics can be made.

Figure 8:
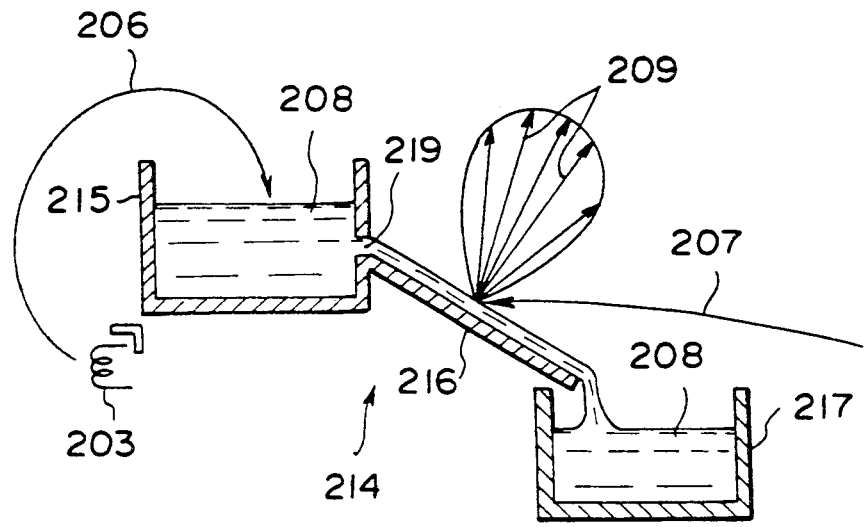
FIGS. 8 and 9 are sectional views showing the major parts of further embodiments of the third vacuum evaporation apparatus in accordance with the present invention.

FIG. 8 is a sectional views showing the major parts of another embodiment of the third vacuum evaporation apparatus in accordance with the present invention.

With reference to FIG. 8, a hearth 214 comprises a first crucible 215, which is provided with a preliminary heating means for melting a deposition material and from which the molten deposition material flows continuously downwardly. The hearth 215 also comprises a guide member 216 for guiding the molten deposition material 208, which has flowed from the first crucible 215, along a predetermined direction and at a predetermined angle of inclination. The hearth 215 further comprises a second crucible 217 for receiving the molten deposition material 208, which has flowed along the guide member 216, and an electron beam generating means (not shown) for generating an electron beam 207.

The first crucible 215 is constituted of a heat-resistant vessel and has a width, which is at least parallel to the width direction of the web 230 located around the cooling can 224 and is approximately equal to the width of the web 230. A slit 219 is formed in the side wall of the first crucible 215, which side wall faces the guide member 216. The slit 219 extends along the width direction of the first crucible 215.

The deposition material accommodated in the first crucible 215 is heated and molten by an electron beam 206 produced by an electron beam generating filament 203, which is located in the vicinity of the first crucible 215. The molten deposition material 208 flows from the slit 219 continuously and uniformly over approximately the whole width of the first crucible 215. Thereafter, the molten deposition material 208 flows along a wide groove of the guide member 216, which continues from the bottom of the slit 219.

The wide groove of the guide member 216 has a slant bottom surface, which faces the circumferential surface of the cooling can 224 and is located such that at least a line, which is normal to the slant bottom surface, intersects perpendicularly to the width direction of the web 230. The wide groove of the guide member 216 guides the molten deposition material 208, which has flowed from the slit 219, at a predetermined angle of inclination. The width of the wide groove of the guide member 216 is approximately equal to the width of the first crucible 215 and the width of the web 230. The width of the stream of the molten deposition material 208 continuously flowing in the wide groove of the guide member 216 is approximately equal to the width of the web 230. The molten deposition material 208 is then received by the second crucible 217. The angle of inclination of the guide member 216 can be changed arbitrarily.

With the hearth 214, the molten deposition material 208 can be fed out of the first crucible 215 at a predetermined rate without the first crucible 215 being swung as in the case of the first crucible 202 shown in FIG. 7. The electron beam 207 is irradiated to a predetermined position on the stream of the molten deposition material 208, which is continuously flowing in the wide groove of the guide member 216. The electron beam 207 is caused to scan along the width direction of the wide groove. In the same manner as that in the hearth 201 shown in FIG. 7, by appropriately setting the angle of inclination of the guide member 216, the center axis of the directivity of the stream of vapor 209 can be inclined by an arbitrary angle from the vertical direction.

Therefore, the efficiency, with which the deposition material is deposited on the web 230, can be kept high. Particularly, in cases where thin ferromagnetic metal film types of magnetic recording media are to be made, magnetic recording media having good magnetic characteristics can be obtained.

With the third vacuum evaporation apparatus in accordance with the present invention, the center axis of the directivity of the stream of vapor 209 can also be directed horizontally. Such an embodiment will be described hereinbelow with reference to FIG. 9.

Figure 9:
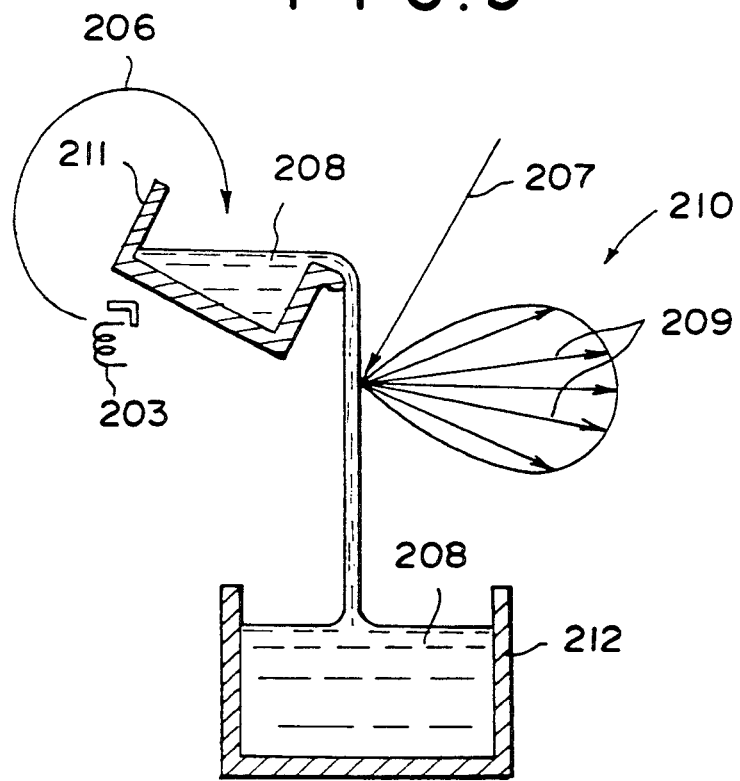

With reference to FIG. 9, a hearth 210 comprises a first crucible 211, which is constituted of a heat-resistant vessel and can swing around a rotation axis extending in the width direction of the first crucible 211, which direction is normal to the plane of the sheet of FIG. 9. The first crucible 211 has a width, which is at least parallel to the width direction of the web 230 located around the cooling can 224 and is approximately equal to the width of the web 230. A cutaway part is formed at the upper edge of the side wall of the first crucible 211, which side wall faces the web 230. The cutaway part extends along the width direction of the first crucible 211. The deposition material accommodated in the first crucible 211 is heated and molten by an electron beam 206 produced by an electron beam generating filament 203, which is located in the vicinity of the first crucible 211. Thereafter, the first crucible 211 is swung by an appropriate angle such that the cutaway part moves downwardly, and the molten deposition material 208 is allowed to flow from the cutaway part continuously and uniformly over approximately the whole width of the first crucible 211. The molten deposition material 208, which has flown from the first crucible 211, is received by a second crucible 212. An electron beam 207 is irradiated to a predetermined position on the stream of the molten deposition material 208, which is continuously flowing vertically. The electron beam 207 is caused to scan horizontally on the stream of the molten deposition material 208. In this manner, a stream of vapor 209 can be obtained such that the center axis of the directivity of the stream of vapor 209 may be directed horizontally.

Figure 10:
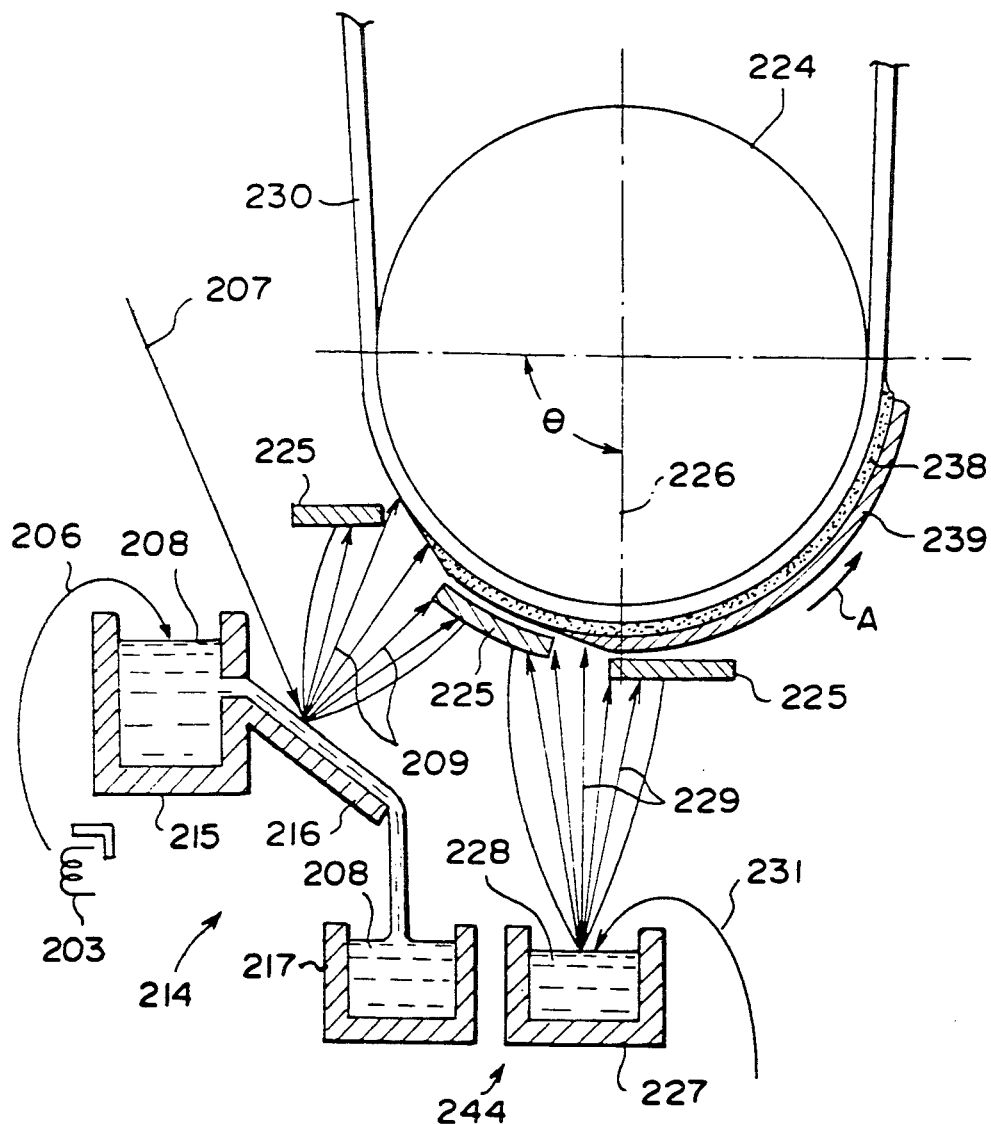
FIGS. 10 and 11 are schematic views showing the embodiments of the fourth vacuum evaporation apparatus in accordance with the present invention.
Figure 11:
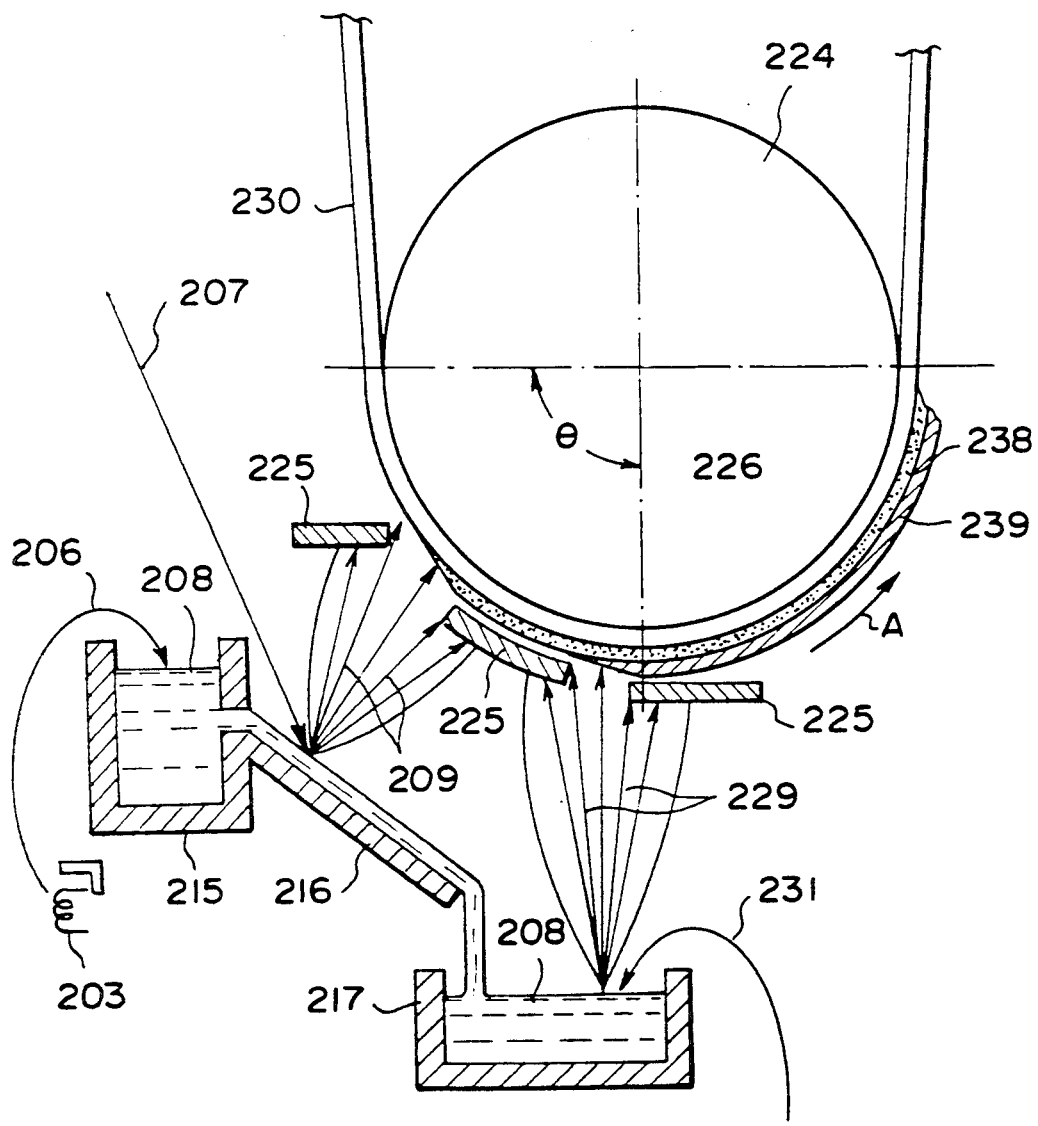
Figure 12:
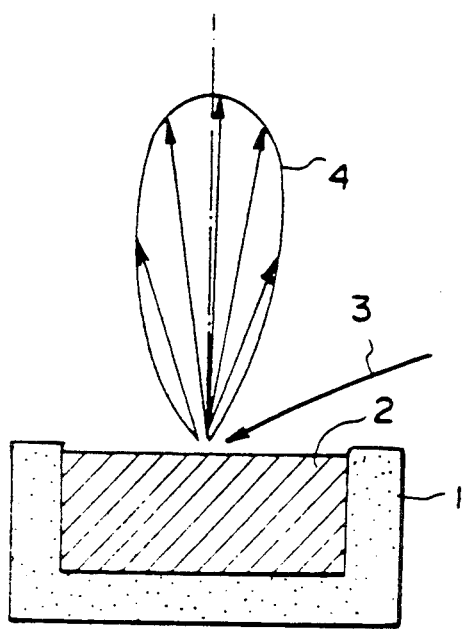
FIGS. 12, 13, and 14 are schematic views showing a conventional technique.
Figure 13:
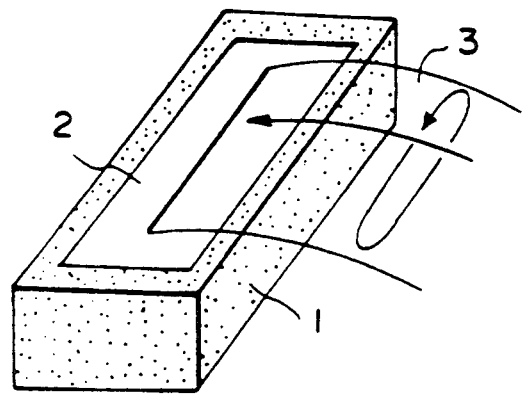

Embodiments of the fourth vacuum evaporation apparatus in accordance with the present invention will be described hereinbelow with reference to FIGS. 10 and 11. In FIGS. 10 and 11, similar elements are numbered with the same reference numerals with respect to each other.

With reference to FIG. 10, a hearth 214 is employed to form a first deposited layer 238 (lower layer) on a web 230. The hearth 214 is constituted in the same manner as that of the hearth 214 shown in FIG. 8. Specifically, the molten deposition material 208 continuously flows obliquely downwardly, and the electron beam 207 is irradiated to the surface of the stream of the molten deposition material 208 from above. In this manner, the stream of vapor 209 of the molten deposition material 208 is produced along a line, which is normal to the surface of the stream of the molten deposition material 208. The stream of vapor 209 impinges upon the web 230, and the first deposited layer 238 is thereby formed on the web 230. Also, a hearth 244 is employed which is provided with a third crucible 227 approximately standing in line with the second crucible 217. The third crucible 227 is used to form a second deposited layer 239 (upper layer). Specifically, a molten deposition material 228 is accommodated in the third crucible 227, and an electron beam 231 is irradiated to the horizontal surface of the molten deposition material 228. In this manner, a stream of vapor 229 of the molten deposition material 228 is produced approximately along the vertical direction. The stream of vapor 229 impinges upon the first deposited layer 238, which has been formed on the web 230, and the second deposited layer 239 is thereby formed on the first deposited layer 238. A middle shield plate 225 is located appropriately to separate the stream of vapor 209 and the stream of vapor 229 from each other.

In the manner described above, a plurality of deposited layers can be formed with a single, simultaneous operation by simultaneously irradiating a plurality of streams of vapor to different parts of the web 230, which is being moved continuously along the circumferential surface of a single cooling can 224. With a conventional technique, in cases where two crucibles corresponding to the second crucible 217 and the third crucible 227 are used in order to form the first deposited layer 238 and the second deposited layer 239 simultaneously and located such that the two streams of vapor produced from the two crucibles may impinge at efficient angles of incidence upon the web 230, locations of the two crucibles that can satisfy the conditions, under which the two deposited layers can be formed efficiently, overlap one upon the other, and little degree of freedom can be obtained in locating the two crucibles. However, as shown in FIG. 10, with the fourth vacuum evaporation apparatus in accordance with the present invention, a markedly high degree of freedom can be obtained in setting the angles at which the stream of vapor 209 and the stream of vapor 229 are irradiated, and a plurality of deposited layers can be formed appropriately and efficiently with a plurality of crucibles. Also, with the fourth vacuum evaporation apparatus in accordance with the present invention, deposition of a plurality of layers can be carried out only with a single cooling can such that the efficiency, with which the deposition materials are deposited, may be kept high and the vacuum evaporation apparatus may be kept small in size.

In the embodiment of FIG. 10, the molten deposition materials 208 and 228 may be different from each other, and therefore the first deposited layer 238 and the second deposited layer 239 can be constituted of different deposition materials.

The embodiment shown in FIG. 11 is constituted in the same manner as that shown in FIG. 10, except that the third crucible 227 in the embodiment of FIG. 10 is omitted and the second crucible 217 serves also as the third crucible 227. This embodiment can be utilized appropriately when the first deposited layer 238 and the second deposited layer 239 are constituted of the same deposition material. Because the third crucible 227 in the embodiment of FIG. 10 can be omitted, the embodiment of FIG. 11 can be kept smaller in size than the embodiment of FIG. 10.

In the embodiments of FIGS. 10 and 11, two streams of vapor are produced. The fourth vacuum evaporation apparatus in accordance with the present invention may also be embodied such that three or more streams of vapor may be produced. In such cases, by way of example, in FIG. 10, a hearth constituted in the same manner as that of the left hearth 214 may be located on the right side of the third crucible 227 and used to form a third deposited layer. Also, in FIG. 11, a hearth constituted in the same manner as that of the hearth shown in FIG. 11 may be located on the right side of the hearth shown in FIG. 11 and used to form third and fourth deposited layers, which are constituted of a material different from the material of the first deposited layer 238 and the second deposited layer 238.

In the aforesaid embodiments of the third and fourth vacuum evaporation apparatuses in accordance with the present invention, as a preliminary heating means for heating and melting the deposition material, the means for heating with the electron beam 206 is utilized. Alternatively, any of other preliminary heating means, such as a resistance heating means and an induction heating means, may be employed.

Also, in the aforesaid embodiments of the third and fourth vacuum evaporation apparatuses in accordance with the present invention, the shapes of the crucibles and the guide members are not limited to those shown, but may be selected from various other shapes.

The first, second, third, and fourth vacuum evaporation apparatuses in accordance with the present invention are not limited to the formation of thin ferromagnetic metal films, but are applicable also when various other types of films, such as electrically conductive films and thin Si films, are formed.

In the configuration shown in FIG. 10, in lieu of the left hearth 214, the hearth 44 in the embodiment of the first vacuum evaporation apparatus shown in FIG. 1 or the hearth 144 in the embodiment of the second vacuum evaporation apparatus shown in FIG. 4 may be employed. Also, in lieu of the right hearth 244, the hearth provided with the crucible 21 having the heat-resistant rollers 23a and 23b shown in FIG. 3 may be employed.

What is claimed is:

1. A vacuum evaporation method in which a deposition material is introduced into a crucible, heated, and evaporated in a vacuum, the resulting stream of vapor of the deposition material is caused to impinge upon a substrate, and a thin film of the deposition material is thereby deposited on the substrate, wherein the improvement comprises the steps of:

i) locating two heat-resistant rollers close to each other such that rotation shafts of two said heat-resistant rollers are approximately parallel to each other, and parts of two said heat-resistant rollers are immersed in the deposition material, which has been molten in said crucible, ii) rotating two said heat-resistant rollers in opposite directions, whereby parts of said molten deposition material are entrained by the circumferential surfaces of two said heat-resistant rollers, and a concave part of said molten deposition material is formed at a region, at which said entrained parts of said molten deposition material come into contact with each other, and iii) irradiating an electron beam to said concave part of said molten deposition material, said molten deposition material being thereby evaporated from said concave part such that the resulting stream of vapor of said molten deposition material may be directed at an oblique angle or approximately horizontally with respect to the surface of said molten deposition material in the region other than the region in which two said heat-resistant rollers are located, whereby a thin film of said deposition material is deposited on said substrate.

2. A method as defined in claim 1 wherein said deposition material is a ferromagnetic metal material.

3. A method as defined in claim 1 wherein said crucible is constituted of a refractory material containing, $MgO$, $Al_2O_3$, $CaO$, or $ZrO$, as a main constituent.

4. A method as defined in claim 1 wherein said heat-resistant rollers are constituted of a machinable ceramic material containing, as a main constituent, $MgO$, $Al_2O_3$, $BeO$, $AlN$, $BN$, or a machinable crystallized glass.

5. A method as defined in claim 1 wherein said deposition material is heated and melted by a preliminary heating means, which is selected from the group consisting of an electron beam heating means, a resistance heating means, and an induction heating means.

6. A vacuum evaporation apparatus comprising:

i) a crucible for accommodating a molten deposition material therein, ii) two heat-resistant rollers, which are located close to each other such that rotation shafts of two said heat-resistant rollers are approximately parallel to each other, and parts of two said heat-resistant rollers are immersed in said molten deposition material in said crucible, iii) a roller rotating mechanism for rotating two said heat-resistant rollers in opposite directions, whereby parts of said molten deposition material are entrained by the circumferential surfaces of two said heat-resistant rollers, and a concave part of said molten deposition material is formed at a region, at which said entrained parts of said molten deposition material come into contact with each other, and iv) an electron beam generating means for irradiating an electron beam to said concave part of said molten deposition material, said molten deposition material being thereby evaporated from said concave part such that the resulting stream of vapor of said molten deposition material may be directed at an oblique angle or approximately horizontally with respect to the surface of said molten deposition material in the region other than the region in which two said heat-resistant rollers are located, whereby a thin film of said deposition material is deposited on a substrate.

7. An apparatus as defined in claim 6 wherein said deposition material is a ferromagnetic metal material.

8. An apparatus as defined in claim 6 wherein said crucible is constituted of a refractory material containing, $MgO$, $Al_2O_3$, $CaO$, or $ZrO$, as a main constituent.

9. An apparatus as defined in claim 6 wherein said heat-resistant rollers are constituted of a machinable ceramic material containing, as a main constituent, $MgO$, $Al_2O_3$, $BeO$, $AlN$, $BN$, or a machinable crystallized glass.

10. An apparatus as defined in claim 6 wherein a preliminary heating means for heating and melting the deposition material is provided, the preliminary heating means being selected from the group consisting of an electron beam heating means, a resistance heating means, and an induction heating means.

11. A vacuum evaporation method in which a deposition material is introduced into a crucible, heated, and evaporated in a vacuum, the resulting stream of vapor of the deposition material is caused to impinge at an oblique angle of incidence upon a substrate, and a thin film of the deposition material is thereby deposited on the substrate, said substrate being positioned along a circumferential surface of a rotatable drum, wherein the improvement comprises the steps of:

i) locating a heat-resistant roller such that part of said heat-resistant roller is immersed in the deposition material, which has been molten in said crucible, ii) rotating said heat-resistant roller, whereby part of said molten deposition material is entrained by the circumferential surface of said heat-resistant roller, and iii) irradiating an electron beam to said entrained part of said molten deposition material at a position on the circumferential surface of said heat-resistant roller, which position is spaced away from the top of said heat-resistant roller, said molten deposition material being thereby evaporated from said position such that the resulting stream of vapor of said molten deposition material may be directed at an oblique angle or approximately horizontally with respect to the surface of said molten deposition material in the region other than the region in which said heat-resistant roller is located, whereby a thin film of said deposition material is deposited on said substrate.

12. A method as defined in claim 11 wherein said deposition material is a ferromagnetic metal material.

13. A method as defined in claim 11 wherein said crucible is constituted of a refractory material containing, $MgO$, $Al_2O_3$, $CaO$, or $ZrO$, as a main constituent.

14. A method as defined in claim 11 wherein said heat-resistant roller is constituted of a machinable ceramic material containing, as a main constituent, $MgO$, $Al_2O_3$, $BeO$, $AlN$, $BN$, or a machinable crystallized glass.

15. A method as defined in claim 11 wherein said deposition material heated and melted by a preliminary heating means, which is selected from the group consisting of an electron beam heating means, a resistance heating means, and an induction heating means.

16. A vacuum evaporation apparatus comprising:
 i) a crucible for accommodating a molten deposition material therein,
 ii) a heat-resistant roller, which is located such that part of said heat-resistant roller is immersed in the deposition material, which has been molten in said crucible,
 iii) a roller rotating mechanism for rotating said heat-resistant roller, whereby part of said molten deposition material is entrained by the circumferential surface of said heat-resistant roller, and
 iv) an electron beam generating means for irradiating an electron beam to said entrained part of said molten deposition material at a position on the circumferential surface of said heat-resistant roller, which position is spaced away from the top of said heat-resistant roller, said molten deposition material being thereby evaporated from said position such that the resulting stream of vapor of said molten deposition material may be directed at an oblique angle or approximately horizontally with respect to the surface of said molten deposition material in the region other than the region in which said heat-resistant roller is located,
 wherein said crucible is located such that said stream of vapor of said molten deposition material may impinge at an oblique angle of incidence upon a substrate, and a thin film of said deposition material may be thereby deposited on the substrate, said substrate being positioned along a circumferential surface of a rotatable drum.

17. An apparatus as defined in claim 16 wherein said deposition material is a ferromagnetic metal material.

18. An apparatus as defined in claim 16 wherein said crucible is constituted of a refractory material containing, MgO, Al₂O₃, CaO, or ZrO, as a main constituent.

19. An apparatus as defined in claim 16 wherein said heat-resistant roller is constituted of a machinable ceramic material containing, as a main constituent, MgO, Al₂O₃, BeO, AlN, BN, or a machinable crystallized glass.

20. An apparatus as defined in claim 16 wherein a preliminary heating means for heating and melting the deposition material is provided, the preliminary heating means being selected from the group consisting of an electron beam heating means, a resistance heating means, and an induction heating means.

21. A vacuum evaporation method comprising the steps of:
 i) continuously causing a deposition material, which has been molten, to flow downwardly,
 ii) irradiating an electron beam to the stream of said molten deposition material at a predetermined position on the stream of said molten deposition material, said molten deposition material being thereby evaporated from said predetermined position such that the resulting stream of vapor of said molten deposition material may be directed along a line, which is normal to the surface of the stream of said molten deposition material, and
 iii) causing the stream of vapor of said molten deposition material to impinge upon a long strip-shaped flexible substrate, which is being moved continuously, whereby a thin film of said deposition material is deposited on said long strip-shaped flexible substrate.

22. A method as defined in claim 21 wherein said deposition material is a ferromagnetic metal material.

23. A method as defined in claim 21 wherein said deposition material is molten in a crucible constituted of a refractory material containing, MgO, Al₂O₃, CaO, or ZrO, as a main constituent.

24. A method as defined in claim 21 wherein said deposition material is heated and molten by a preliminary heating means, which is selected from the group consisting of an electron beam heating means, a resistance heating means, and an induction heating means.

25. A vacuum evaporation apparatus, which is provided with a hearth comprising:
 i) a first crucible, which is provided with a heating means for melting a deposition material and from which the molten deposition material flows continuously downwardly,
 ii) a guide member for guiding said molten deposition material, which has flowed from said first crucible, along a predetermined direction and at a predetermined angle of inclination, such that the stream of said molten deposition material, which is being guided by said guide member, may face a cooling can,
 iii) a second crucible for receiving said molten deposition material, which has flowed along said guide member, and
 iv) an electron beam generating means for generating an electron beam,
 wherein said electron beam is irradiated to the stream of said molten deposition material, which is being guided by said guide member, at a predetermined position on the stream of said molten deposition material, said molten deposition material being thereby evaporated from said predetermined position such that the resulting stream of vapor of said molten deposition material may be directed along a line, which is normal to the surface of the stream of said molten deposition material, and
 the stream of vapor of said molten deposition material is caused to impinge upon a long strip-shaped flexible substrate, which is being moved continuously along the circumferential surface of said cooling can, whereby a thin film of said deposition material is deposited on said long strip-shaped flexible substrate.

26. An apparatus as defined in claim 25 wherein said deposition material is a ferromagnetic metal material.

27. An apparatus as defined in claim 25 wherein said first crucible, said guide member, and said second crucible are constituted of a refractory material containing, MgO, Al₂O₃, CaO, or ZrO, as a main constituent.

28. An apparatus as defined in claim 25 wherein said heating means for melting the deposition material is selected from the group consisting of an electron beam heating means, a resistance heating means, and an induction heating means.

29. A vacuum evaporation method comprising the steps of:
 i) producing a first stream of vapor of a deposition material by:
  a) continuously causing the deposition material, which has been molten, to flow obliquely downwardly,
  b) irradiating an electron beam to the stream of said molten deposition material, said molten deposition material being thereby evaporated such that the resulting first stream of vapor of said molten deposition material may be directed along a line, which is normal to the surface of the stream of said molten deposition material, ii) producing a second stream of vapor of a deposition material by irradiating an electron beam to the horizontal surface of the deposition material, which has been molten, said molten deposition material being thereby evaporated such that the resulting second stream of vapor of said molten deposition material may be directed along an approximately vertical direction, and iii) simultaneously irradiating said first stream of vapor and said second stream of vapor to different parts of a long strip-shaped flexible substrate, which is being moved continuously, whereby a plurality of deposited layers are formed on said long strip-shaped flexible substrate with a single, simultaneous operation.

30. A method as defined in claim 29 wherein said deposition materials are ferromagnetic metal materials.

31. A method as defined in claim 29 wherein said deposition materials are molten in crucibles constituted of a refractory material containing, MgO, Al$_2$O$_3$, CaO, or ZrO, as a main constituent.

32. A method as defined in claim 29 wherein said deposition materials are heated and molten by a plurality of preliminary heating means, which are selected from the group consisting of an electron beam heating means, a resistance heating means, and an induction heating means.

33. A vacuum evaporation apparatus comprising:

i) a first crucible, which is provided with a heating means for melting a deposition material and from which the molten deposition material flows continuously downwardly, ii) a guide member for guiding said molten deposition material, which has flowed from said first crucible, at a predetermined angle of inclination, such that the stream of said molten deposition material, which is being guided by said guide member, may face a long strip-shaped flexible substrate, which is being moved continuously along the circumferential surface of a cooling can, iii) another crucible in which a molten deposition material is accommodated such that it may have a horizontal surface facing said long strip-shaped flexible substrate, and iv) a plurality of electron beam generating means for generating electron beams, wherein a first stream of vapor is produced from the surface of the stream of said molten deposition material, which is being guided by said guide member at a predetermined angle of inclination, by irradiating an electron beam to said stream of said molten deposition material and evaporating said molten deposition material, a second stream of vapor is produced from the surface of said molten deposition material, which is accommodated in said another crucible, by irradiating an electron beam thereto, and said first stream of vapor and said second stream of vapor are simultaneously irradiated to different parts of said long strip-shaped flexible substrate, whereby a plurality of deposited layers are formed on said long strip-shaped flexible substrate with a single, simultaneous operation.

34. An apparatus as defined in claim 33 wherein said another crucible serves as a second crucible, which receives said molten deposition material, which has flowed from said first crucible and has been guided along said guide member.

35. An apparatus as defined in claim 33 wherein said deposition material is a ferromagnetic metal material.

36. An apparatus as defined in claim 33 wherein said first crucible, said guide member, and said another crucible are constituted of a refractory material containing, MgO, Al$_2$O$_3$, CaO, or ZrO, as a main constituent.

37. An apparatus as defined in claim 33 wherein said heating means for melting the deposition material is selected from the group consisting of an electron beam heating means, a resistance heating means, and an induction heating means.

* * * * *